United States Patent
Takatsuji et al.

(10) Patent No.: US 10,873,255 B2
(45) Date of Patent: Dec. 22, 2020

(54) POWER SUPPLY DEVICE

(71) Applicant: Murata Manufacturing Co., Ltd., Kyoto-fu (JP)

(72) Inventors: Hiroyuki Takatsuji, Nagaokakyo (JP); Hiroshi Kitada, Nagaokakyo (JP); Naomichi Enoki, Nagaokakyo (JP); Yoshihiro Imanishi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/909,992

(22) Filed: Jun. 23, 2020

(65) Prior Publication Data

US 2020/0321856 A1 Oct. 8, 2020

Related U.S. Application Data

(63) Continuation of application No. PCT/JP2018/042144, filed on Nov. 14, 2018.

(30) Foreign Application Priority Data

Dec. 27, 2017 (JP) .................. 2017-251066

(51) Int. Cl.
*H02M 1/42* (2007.01)
*H02M 1/12* (2006.01)
(Continued)

(52) U.S. Cl.
CPC .......... *H02M 1/4258* (2013.01); *H01F 17/00* (2013.01); *H02M 1/126* (2013.01);
(Continued)

(58) Field of Classification Search
CPC .......... H03H 7/06; H03H 7/09; H03H 7/0115; H03H 7/427; H01F 17/00; H01F 17/04;
(Continued)

(56) References Cited

U.S. PATENT DOCUMENTS 4,881,058 A * 11/1989 Berry, III ............... G08B 27/00
340/326
5,200,672 A * 4/1993 Sheynberg ......... H05B 41/2806
315/248

(Continued)

FOREIGN PATENT DOCUMENTS

JP 59216468 * 5/1983 ............. H02M 1/12
JP S61-205290 U 12/1986
(Continued)

OTHER PUBLICATIONS

International Search Report issued in PCT/JP2018/1342144; dated Jan. 15, 2019.

(Continued)

*Primary Examiner* — Thienvu V Tran
*Assistant Examiner* — Nusrat Quddus
(74) *Attorney, Agent, or Firm* — Studebaker & Brackett PC

(57) ABSTRACT

An on-board charger includes input ports, output ports, an AC-DC converter, an isolated DC-DC converter, a first filter, and a second filter. The first filter is connected to the input ports. The first filter includes a first common mode choke coil, a first across-the-line capacitor, and first line bypass capacitors. The second filter is connected between the isolated DC-DC converter and each of the output ports. The second filter includes a second common mode choke coil and second line bypass capacitors.

20 Claims, 13 Drawing Sheets

(51) Int. Cl.
*H01F 17/00* (2006.01)
*H02M 3/28* (2006.01)
*H02M 7/217* (2006.01)
*H03H 7/01* (2006.01)

(52) U.S. Cl.
CPC ............ *H02M 3/28* (2013.01); *H02M 7/217* (2013.01); *H03H 7/0115* (2013.01); H01F 2017/0093 (2013.01)

(58) Field of Classification Search
CPC . H01F 2017/0093; H02M 7/217; H02M 7/06; H02M 5/458; H02M 1/12; H02M 1/4258; H02M 1/126; H02M 1/44; H02M 1/32; H02M 1/4216; H02M 1/14; H02M 2001/0064; H02M 2001/123; H02M 2001/342; H02M 2001/344; H02M 2001/346; H02M 2001/348; H02M 3/00; H02M 3/02; H02M 3/10; H02M 3/145; H02M 3/155; H02M 3/156; H02M 3/158; H02M 3/1584; H02M 3/1588; H02M 3/28; H02M 3/335
See application file for complete search history.

(56) References Cited

U.S. PATENT DOCUMENTS

| | | | | |
|---|---|---|---|---|
| 5,864,473 A * | 1/1999 | Slack | ............... | H02M 3/33546 363/21.08 |
| 6,850,728 B2 * | 2/2005 | Yokozeki | ........... | G03G 15/2042 219/216 |
| 6,933,479 B2 * | 8/2005 | Tanaka | ............... | G03G 15/2053 219/619 |
| 2007/0035971 A1 * | 2/2007 | Yasumura | ........... | H02M 1/4241 363/21.02 |
| 2007/0195560 A1 * | 8/2007 | Yasumura | ............... | H02M 1/42 363/21.01 |
| 2014/0266507 A1 * | 9/2014 | Fauer | ................... | H03H 1/0007 333/181 |
| 2016/0065085 A1 * | 3/2016 | Hamamoto | ........... | H05B 45/37 315/200 R |
| 2016/0378052 A1 * | 12/2016 | Kosaka | ................... | G03G 15/80 399/88 |
| 2017/0063216 A1 * | 3/2017 | Fujiwara | ............... | H02M 7/06 |
| 2017/0237340 A1 * | 8/2017 | Long | ............... | H02M 1/4258 307/82 |
| 2017/0256356 A1 * | 9/2017 | Takatsuji | ............... | H01F 27/292 |
| 2017/0302165 A1 * | 10/2017 | Marcinkiewicz | ... | H02M 1/4208 |
| 2018/0145716 A1 * | 5/2018 | Saito | ........................ | H04B 1/40 |
| 2019/0386630 A1 * | 12/2019 | Higuchi | ............... | H03M 9/00 |

FOREIGN PATENT DOCUMENTS

| | | |
|---|---|---|
| JP | 2001-309652 A | 11/2001 |
| JP | 2007-325394 A | 12/2007 |
| JP | 2009-267596 A | 11/2009 |
| JP | 2016-082792 A | 5/2016 |

OTHER PUBLICATIONS

Written Opinion issued in PCT/JP2018/042144; dated Jan. 15, 2019.

* cited by examiner

POWER SUPPLY DEVICE

CROSS-REFERENCE TO RELATED APPLICATIONS

This application claims benefit of priority to International Patent Application No. PCT/JP2018/042144, filed Nov. 14, 2018, and to Japanese Patent Application No. 2017-251066, filed Dec. 27, 2017, the entire contents of each are incorporated herein by reference.

BACKGROUND

Technical Field

The present disclosure relates to a power supply device that converts alternating current power to direct current power.

Background Art

For example, power supply devices such as on-board chargers that convert alternating current power to direct current power are known, as described, for example, in Japanese Unexamined Patent Application Publication No. 2007-325394. The power supply device described in Japanese Unexamined Patent Application Publication No. 2007-325394 includes a power factor correction circuit (PFC circuit) and an isolated DC-DC converter. In such a power supply device, to restrain conducted emission in alternating current input, input lines on the alternating current side are provided with a circuit against noise including a common mode choke coil, an across-the-line capacitor, and a line bypass capacitor.

SUMMARY

In the power supply device described in Japanese Unexamined Patent Application Publication No. 2007-325394, the circuit against noise on the alternating current side can reduce noise of, for example, 10 MHz or lower. However, a sufficient reduction effect is not obtained for noise of high frequencies of 10 MHz or higher.

The present disclosure thus provides a power supply device also capable of reducing high frequency noise.

Accordingly, the present disclosure provides a power supply device including input ports respectively connected to two alternating current lines to which alternating current power is input, output ports respectively connected to two direct current lines from which direct current power is output, a first filter connected to the input ports, an AC-DC converter that is connected to the first filter and that converts the alternating current power to the direct current power, an isolated DC-DC converter that is connected to the AC-DC converter and that converts a direct current voltage to a direct current voltage having a predetermined voltage value, and a second filter connected between the isolated DC-DC converter and each of the output ports. The first filter includes at least one first common mode choke coil connected at halfway points of the two alternating current lines, at least one first across-the-line capacitor connected between the two alternating current lines, and at least one first line bypass capacitor connected between each of the two alternating current lines and a ground. The second filter includes at least one second common mode choke coil and a second line bypass capacitor, the second common mode choke coil being connected at halfway points of the two direct current lines, the second line bypass capacitor being connected between each of the two direct current lines and a ground.

According to the present disclosure, for example, the first filter on the alternating current side can reduce noise of 10 MHz or lower, and in addition, the second filter on the direct current side can reduce noise of 10 MHz or higher. As the result, noise in a wide band can be restrained.

DETAILED DESCRIPTION

Hereinafter, on-board chargers are each taken as an example of a power supply device according to a corresponding one of embodiments of the present disclosure and are described in detail with reference to the accompanying drawings.

Figure 1:
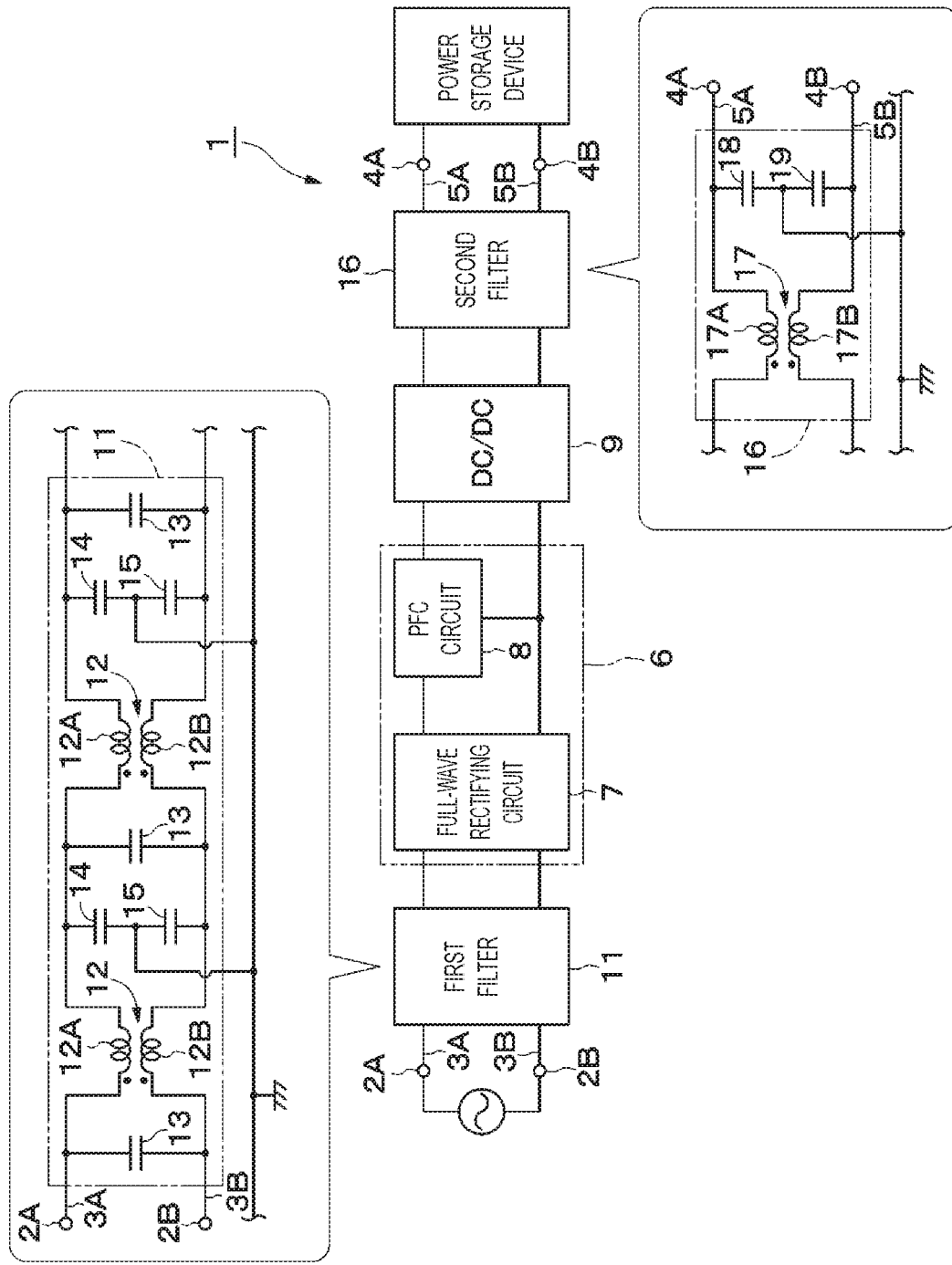
FIG. 1 is a block diagram illustrating an on-board charger according to a first embodiment of the present disclosure.

FIG. 1 illustrates an on-board charger 1 serving as a power supply device according to a first embodiment of the present disclosure. The on-board charger 1 is installed, for example, in the electric vehicle. The on-board charger 1 charges a power storage device (battery) such as a lithium-ion battery by using a commercial power supply. The on-board charger 1 includes input ports 2A and 2B, output ports 4A and 4B, an AC-DC converter 6, an isolated DC-DC converter 9, a first filter 11, and a second filter 16.

The input ports 2A and 2B are connected to, for example, an external commercial power supply and receives alternating current power. To the input ports 2A and 2B, alternating current lines 3A and 3B that transmit the alternating current power are respectively connected.

The output ports 4A and 4B are connected to the power storage device installed, for example, in the vehicle and supplies direct current power to the power storage device. To the output ports 4A and 4B, direct current lines 5A and 5B that transmit the direct current power are respectively connected. In this case, positive (plus) voltage is supplied to the direct current line 5A that is one of the direct current lines 5A and 5B, and negative (minus) voltage is supplied to the direct current line 5B that is the other.

The AC-DC converter 6 converts the alternating current power input from the input ports 2A and 2B to the direct current power and outputs the direct current power. The AC-DC converter 6 includes a full-wave rectifying circuit 7 and a power factor correction circuit 8 (hereinafter, referred to as a PFC circuit 8). The full-wave rectifying circuit 7 is composed of a bridge full-wave rectifying circuit (diode bridge circuit) using, for example, four diodes (not illustrated). The full-wave rectifying circuit 7 performs full-wave rectification on the alternating current power supplied from the input ports 2A and 2B. Note that a smoothing capacitor may be connected to the full-wave rectifying circuit 7 on the output side.

The PFC circuit 8 is connected to the full-wave rectifying circuit 7 on the output side and is a circuit that causes the power factor of the power supply to approach to 1. The PFC circuit 8 includes, for example, an inductor, a diode, and a switching element (each of which is not illustrated) and generates sinusoidal current. Specifically, the alternating current power supplied from the commercial power supply is rectified by the full-wave rectifying circuit 7, the switching element (such as a MOSFET) of the PFC circuit 8 is turned on and off, the voltage is thereby raised, and the power factor is improved in the meantime.

The isolated DC-DC converter 9 is connected to the PFC circuit 8 on the output side and is a circuit that converts a direct current voltage to a voltage having a predetermined voltage value. The isolated DC-DC converter 9 includes, for example, a transformer, a diode, a capacitor, and a switching element (each of which is not illustrated). The switching element (such as a MOSFET) is turned on and off, power output from the PFC circuit 8 is thereby transmitted from the primary coil of the transformer to a secondary coil, rectification is performed by using the diode, and smoothing is performed by the capacitor.

The first filter 11 is connected to the input ports 2A and 2B. Specifically, the first filter 11 is located between the AC-DC converter 6 and each of the input ports 2A and 2B and is connected to the alternating current lines 3A and 3B each located between a corresponding one of the input ports 2A and 2B and the AC-DC converter 6. The first filter 11 includes first common mode choke coils 12 connected at halfway points of the two alternating current lines 3A and 3B, first across-the-line capacitors 13 each connected between the two alternating current lines 3A and 3B, and first line bypass capacitors 14 and 15 each connected between the ground (earth) and a corresponding one of the two alternating current lines 3A and 3B.

Each first common mode choke coil 12 includes a choke coil 12A connected to the alternating current line 3A and a choke coil 12B connected to the alternating current line 3B. The first common mode choke coil 12 does not act as an inductor in a differential mode (normal mode) in which current flows to the alternating current lines 3A and 3B in mutually different directions. Accordingly, the first common mode choke coil 12 has a low impedance (normal mode impedance) in the differential mode.

In contrast, the first common mode choke coil 12 acts as the inductor in a common mode in which current flows to the alternating current lines 3A and 3B in mutually the same direction. Accordingly, the first common mode choke coil 12 has a high impedance (common mode impedance) in the common mode. The first common mode choke coil 12 thereby eliminates noise in the common mode.

Each first across-the-line capacitor 13 attenuates normal mode noise. The first across-the-line capacitor 13 has a low impedance in the normal mode noise of high frequencies. The first across-the-line capacitor 13 restrains the normal mode noise of the high frequencies from propagating to the alternating current lines 3A and 3B.

Each first line bypass capacitor 14 is connected between the alternating current line 3B and the ground. Each first line bypass capacitor 15 is connected between the alternating current line 3A and the ground. The first line bypass capacitors 14 and 15 eliminate noise to propagate to the alternating current lines 3A and 3B. Specifically, the first line bypass capacitors 14 and 15 deviate, to the ground, the noise to propagate to the alternating current lines 3A and 3B.

In the first filter 11, connection is formed in the order of a first across-the-line capacitor 13, a first common mode choke coil 12, the first line bypass capacitors 14 and 15, a first across-the-line capacitor 13, a first common mode choke coil 12, the first line bypass capacitors 14 and 15, and a first across-the-line capacitor 13 according to nearness to the input ports 2A and 2B. In this case, the two first common mode choke coils 12 may have mutually the same inductance value or may have mutually different inductance values. The three first across-the-line capacitors 13 may have mutually the same capacitance value or may have mutually different capacitance values. The first line bypass capacitors 14 and 15 the numbers of which are each 2 may have mutually the same capacitance value or may have mutually different capacitance values.

The second filter 16 is connected to the output ports 4A and 4B. Specifically, the second filter 16 is located between the isolated DC-DC converter 9 and each of the output ports 4A and 4B and is connected to the direct current lines 5A and 5B each located between a corresponding one of the output ports 4A and 4B and the isolated DC-DC converter 9. The second filter 16 includes a second common mode choke coil 17 and second line bypass capacitors 18 and 19, the second common mode choke coil 17 being connected at halfway points of the two direct current lines 5A and 5B, the second line bypass capacitors 18 and 19 being each connected between a corresponding one of the two direct current lines 5A and 5B and the ground.

The second common mode choke coil 17 includes a choke coil 17A connected to the direct current line 5A and a choke coil 17B connected to the direct current line 5B. The second common mode choke coil 17 does not act as an inductor in the differential mode (normal mode) in which current flows to the direct current lines 5A and 5B in mutually different directions. Accordingly, the second common mode choke coil 17 has a low impedance (normal mode impedance) in the differential mode.

In contrast, the second common mode choke coil 17 acts as the inductor in the common mode in which current flows to the direct current lines 5A and 5B in mutually the same direction. Accordingly, the second common mode choke coil 17 has a high impedance (common mode impedance) in the common mode. The second common mode choke coil 17 thereby eliminates noise in the common mode.

The second line bypass capacitor 18 is connected between the direct current line 5B and the ground. The second line bypass capacitor 19 is connected between the direct current line 5A and the ground. The second line bypass capacitors 18 and 19 eliminate noise to propagate to the direct current lines 5A and 5B. Specifically, the second line bypass capacitors 18 and 19 deviate, to the ground, the noise to propagate to the direct current lines 5A and 5B.

In the second filter 16, the second line bypass capacitors 18 and 19 are connected closer to the output side than the second common mode choke coil 17 is. Accordingly, in the second filter 16, connection is formed in the order of the second line bypass capacitors 18 and 19 and the second common mode choke coil 17 according to nearness to the output ports 4A and 4B. In this case, the inductance value of the second common mode choke coil 17 of the second filter 16 is a value lower than the inductance value of the at least one first common mode choke coil 12 included in the first filter 11.

The on-board charger 1 according to this embodiment has the configuration as described above, and hereinafter operations thereof will be described.

After the alternating current power from the commercial power supply is input via the input ports 2A and 2B, the AC-DC converter 6 converts alternating current power to direct current power. Specifically, the alternating current power is rectified by the full-wave rectifying circuit 7, the switching element (such as a MOSFET) of the PFC circuit 8 is turned on and off, the voltage is thereby raised, and the power factor is improved in the meantime. The direct current voltage of the direct current power output from the PFC circuit 8 is converted to a voltage having a predetermined desired value by the isolated DC-DC converter 9. The direct current power converted by the isolated DC-DC converter 9 to have the predetermined voltage value is supplied from the output ports 4A and 4B to the power storage device. The power storage device is thereby charged with the direct current power output from the on-board charger 1.

The switching element of the PFC circuit 8 and the switching element of the isolated DC-DC converter 9 repeat turning on and off, and thereby various noise (common mode noise and normal mode noise) propagates to the alternating current lines 3A and 3B and the direct current lines 5A and 5B.

To cope with this, the first filter 11 is connected to the input ports 2A and 2B of the on-board charger 1. In this case, the first filter 11 includes the first common mode choke coils 12, the first across-the-line capacitors 13, and the first line bypass capacitors 14 and 15. Accordingly, the first filter 11 can reduce the noise to propagate to the alternating current lines 3A and 3B by using the first common mode choke coils 12, the first across-the-line capacitors 13, and the first line bypass capacitors 14 and 15. That is, the first common mode choke coils 12 reduce the common mode noise of the alternating current lines 3A and 3B. The first across-the-line capacitors 13 attenuate the normal mode noise. The first line bypass capacitors 14 and 15 eliminate the noise to propagate to the alternating current lines 3A and 3B.

Note that the inductance of the first common mode choke coil 12 is set as a relatively high value (for example, from 0.1 mH to 10 mH). Accordingly, the first filter 11 can reduce the noise level of a frequency lower than 10 MHz to, for example, 60 dB µV or lower.

In addition, the switching noise of the isolated DC-DC converter 9 or the like propagates to the direct current lines 5A and 5B of the on-board charger 1 in some cases. To cope with this, the second filter 16 is connected to the output ports 4A and 4B of the on-board charger 1. In this case, the second filter 16 includes the second common mode choke coil 17 and the second line bypass capacitors 18 and 19. Accordingly, the second filter 16 can reduce the noise to propagate to the direct current lines 5A and 5B by using the second common mode choke coil 17 and the second line bypass capacitors 18 and 19.

Note that the low-frequency part of noise on the input side (the input ports 2A and 2B side) of the on-board charger 1 is reduced by the first filter 11. This leads to a large number of high frequency components not eliminated by the first filter 11 as the noise on the output side (the output ports 4A and 4B side) of the on-board charger 1.

At this time, the inductance of the second common mode choke coil 17 is set as a value (for example, from 0.1 µH to 10 µH) lower than the inductance of the first common mode choke coil 12. Accordingly, the second filter 16 can lower the noise level of a high frequency from 10 MHz to 30 MHz to, for example, 60 dB µV or lower.

Figure 2:
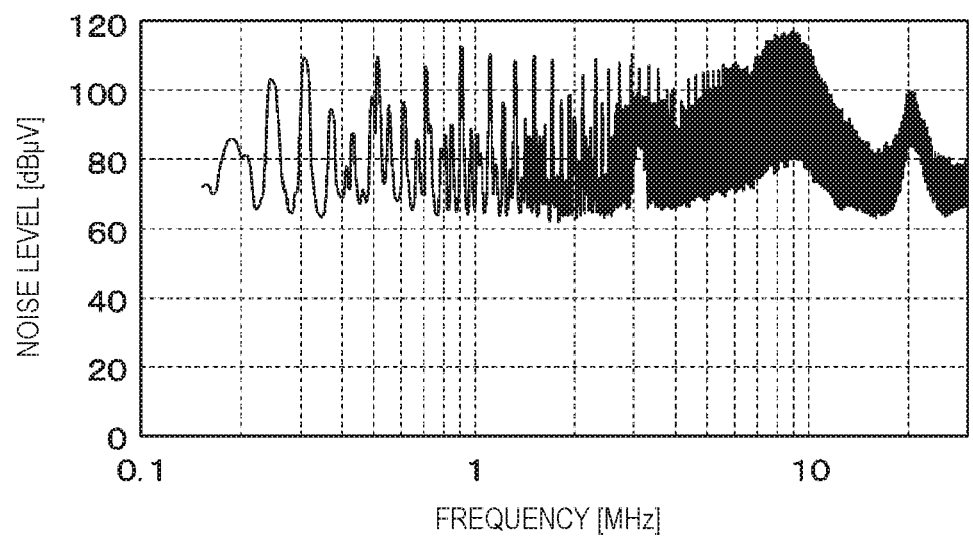
FIG. 2 is a characteristic curve diagram illustrating the frequency characteristics of noise levels in a first comparative example.
Figure 3:
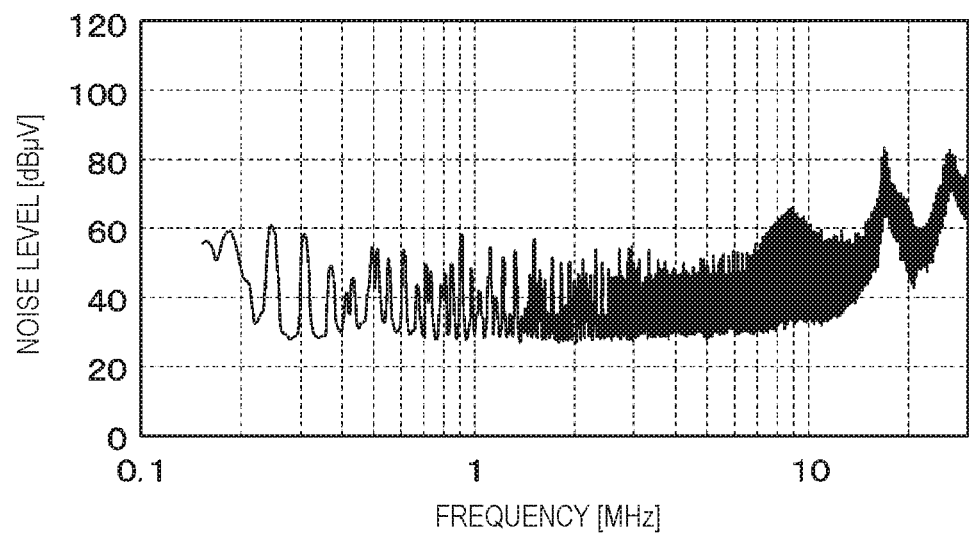
FIG. 3 is a characteristic curve diagram illustrating the frequency characteristics of noise levels in a second comparative example.
Figure 4:
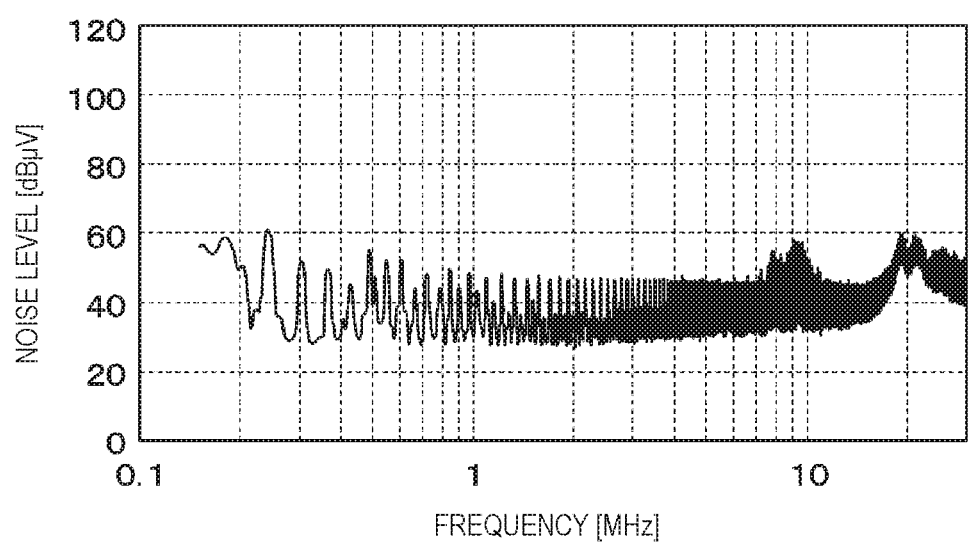
FIG. 4 is a characteristic curve diagram illustrating the frequency characteristics of noise levels in the first embodiment.

To verify the noise elimination effects of the first filter 11 and the second filter 16 as described above, the frequency characteristics of noise levels are measured in configurations with and without the first filter 11 and the second filter 16. FIGS. 2 to 4 illustrate the results thereof.

FIG. 2 illustrates the frequency characteristics of noise levels measured in a configuration as a first comparative example in which both of the first filter 11 and the second filter 16 are omitted. As illustrated in FIG. 2, in the first comparative example, conducted emission exceeding a limit value by 50 dB or higher is present, for example, in a band from 0.15 MHz to 30 MHz, the limit value being specified in CISPR 11 that is an international standard.

In contrast, FIG. 3 illustrates the frequency characteristics of noise levels in a configuration as a second comparative example in which the first filter 11 is provided and the second filter 16 is omitted. In this case, the inductance value of the first common mode choke coil 12 is 1 mH. As illustrated in FIG. 3, in the second comparative example, the conducted emission is considerably reduced as compared with the first comparative example. However, also in the second comparative example, the noise exceeding the limit value specified in CISPR 11 by 20 dB or higher is present in a band from 10 MHz to 30 MHz.

In contrast, FIG. 4 illustrates the frequency characteristics of the noise levels measured by the on-board charger 1 according to the first embodiment. In this case, the on-board charger 1 includes both of the first filter 11 and the second filter 16. The inductance value of the first common mode choke coil 12 is 1 mH. The inductance value of the second common mode choke coil 17 is 2 µH.

As illustrated in FIG. 4, the on-board charger 1 according to the first embodiment can reduce the conducted emission in the low frequency band of 10 MHz or lower, like the second comparative example. In addition to this, the on-board charger 1 according to the first embodiment restrains the conducted emission by 20 dB or higher in the band from 10 MHz to 30 MHz compared with the second comparative example. As the result, the on-board charger 1 according to the first embodiment can satisfy the limit value of CISPR 11.

Note that also in the configuration in the second comparative example, there is a possibility in which noise on the high frequency side can be reduced by using a coil having a high inductance value and a capacitor having a high capacitance value. However, this configuration has a problem that the entire device becomes larger. A configuration using a snubber circuit and gate resistance is also conceivable to restrain noise. However, this configuration has a problem that efficiency is lowered.

In contrast, the on-board charger 1 according to the first embodiment can obtain almost the same efficiency and power factor as those in the configuration without the first filter 11 and the second filter 16 (first comparative example). For example, in the first comparative example, 88.1% efficiency and a power factor of 0.99 are obtained. If the first filter 11 and the second filter 16 are provided on the same condition, 88.1% efficiency and a power factor of 1 are obtained. As described above, also in the on-board charger 1 including the first filter 11 and the second filter 16, the efficiency and the power factor are not lowered in comparison with the configuration without the first filter 11 and the second filter 16.

The on-board charger 1 according to this embodiment thus includes the first filter 11 connected to the input ports 2A and 2B and the second filter 16 connected between the isolated DC-DC converter 9 and each of the output ports 4A and 4B. In addition, the first filter 11 includes the first common mode choke coils 12 connected at the halfway points of the two alternating current lines 3A and 3B, the first across-the-line capacitors 13 each connected between the two alternating current lines 3A and 3B, and the first line bypass capacitors 14 and 15 each connected between the ground and a corresponding one of the two alternating current lines 3A and 3B, and the second filter 16 includes the second common mode choke coil 17 connected at the halfway points of the two direct current lines 5A and 5B and the second line bypass capacitors 18 and 19 each connected between a corresponding one of the two direct current lines 5A and 5B and the ground.

This enables not only the first filter 11 on the alternating current side to reduce noise of, for example, 10 MHz or lower but also the second filter 16 on the direct current side to reduce noise of, for example, 10 MHz or higher. As the result, compared with the configuration without the first filter 11 and the second filter 16, conducted emission on the alternating current input side can be restrained to be low, and noise in a wide band can be restrained.

The inductance value of the second common mode choke coil 17 of the second filter 16 is lower than the inductance value of the at least one first common mode choke coil 12 included in the first filter 11. Here, as a path of noise causing problem of the conducted emission on the alternating current input side, a path through which the switching noise of the PFC circuit 8 and the isolated DC-DC converter 9 directly propagates to the alternating current lines 3A and 3B is conceivable. The noise directly propagating to the alternating current lines 3A and 3B includes low frequency noise. Accordingly, the first filter 11 connected to the alternating current lines 3A and 3B needs to include the first common mode choke coils 12 having a high inductance value.

In contrast, a path through which the switching noise of the isolated DC-DC converter 9 propagates to the direct current lines 5A and 5B and then to the alternating current input side via the reference ground is conceivable as a noise path. As described above, as noise propagating from the direct current side to the alternating current side, only high frequency noise is present. Accordingly, it suffices that the second filter 16 connected to the direct current lines 5A and 5B includes the second common mode choke coil 17 having a low inductance value. As the result, the second common mode choke coil 17 and the second filter 16 can be downsized.

In the second filter 16, the second line bypass capacitors 18 and 19 are connected closer to the output side than the second common mode choke coil 17 is. That is, the second line bypass capacitors 18 and 19 are located farther from the isolated DC-DC converter 9 as a noise generation source than the second common mode choke coil 17 is. Accordingly, the direct current power is supplied to the second line bypass capacitors 18 and 19, with the noise being reduced by the second common mode choke coil 17. This leads to a decrease of noise to be eliminated by the second line bypass capacitors 18 and 19 compared with the configuration in which the second common mode choke coil 17 is connected closer to the output side than the second line bypass capacitors 18 and 19 are. This reduces the possibility in which the noise deviated to the ground via the second line bypass capacitors 18 and 19 bypasses to the alternating current side via the ground.

Further, the first filter 11 and the second filter 16 are applied to the on-board charger 1. In this case, the first filter 11 and the second filter 16 are composed of passive elements and do not lower the power factor in the power conversion. Accordingly, the power storage device installed in the vehicle can be charged with high efficiency.

Figure 5:
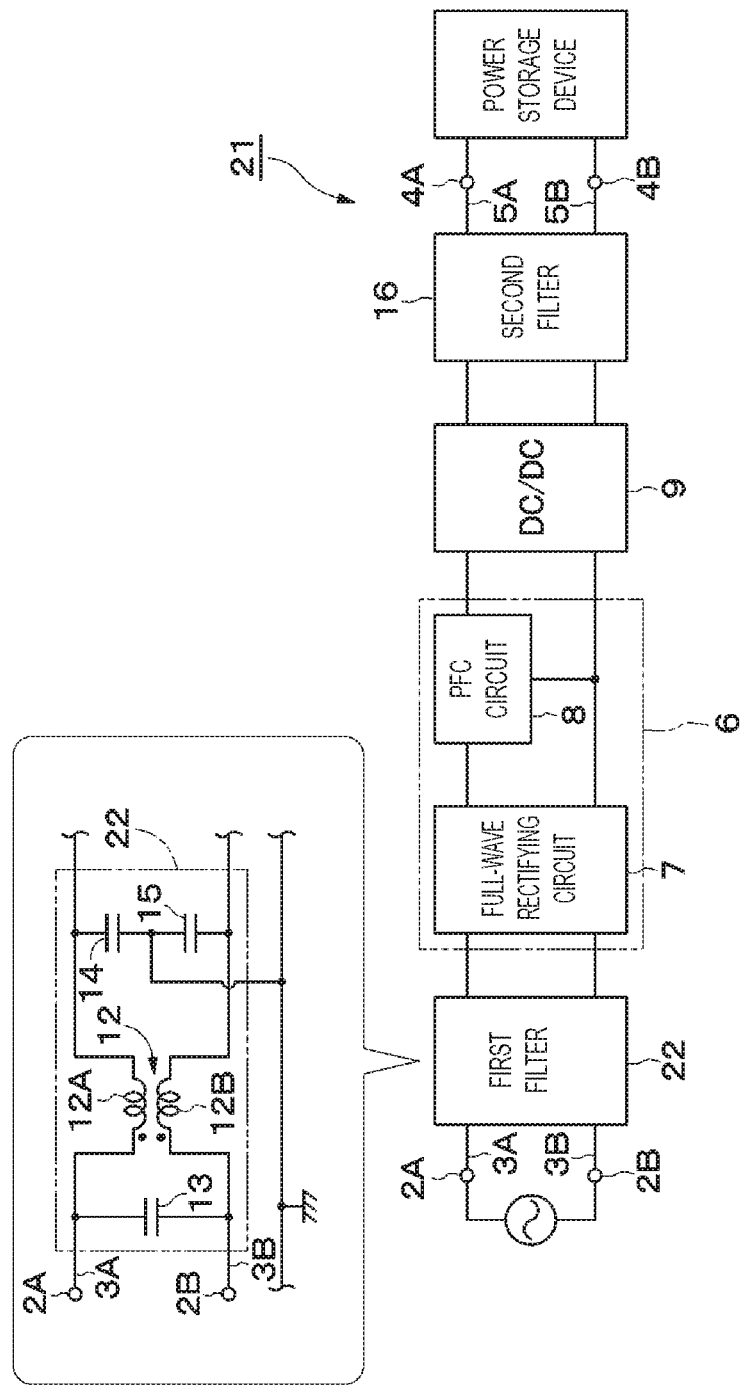
FIG. 5 is a block diagram illustrating an on-board charger according to a second embodiment of the present disclosure.

Subsequently, FIG. 5 illustrates a second embodiment of the present disclosure. The characteristic of the second embodiment lies in that in a first filter, connection is formed in the order of the first across-the-line capacitor, the first common mode choke coil, and the first line bypass capacitor according to nearness to the input ports. In the second embodiment, the same components as those in the afore-mentioned first embodiment are denoted by the same reference numerals, and description thereof is omitted.

An on-board charger 21 according to the second embodiment includes the input ports 2A and 2B, the output ports 4A and 4B, the AC-DC converter 6, the isolated DC-DC converter 9, a first filter 22, and the second filter 16, like the first embodiment.

The first filter 22 is connected to the input ports 2A and 2B. The first filter 22 includes the first common mode choke coil 12, the first across-the-line capacitor 13, and the first line bypass capacitors 14 and 15. In this case, in the first filter 22, connection is formed in the order of the first across-the-line capacitor 13, the first common mode choke coil 12, and the first line bypass capacitors 14 and 15 according to nearness to the input ports 2A and 2B.

Also in the second embodiment in the configuration as described above, almost the same effects and operations as those in the afore-mentioned first embodiment can thus be obtained. In addition, since the first filter 22 includes the first common mode choke coil 12, the first across-the-line capacitor 13, and the first line bypass capacitors 14 and 15 the numbers of which are each 1, the configuration can be simplified.

Figure 6:
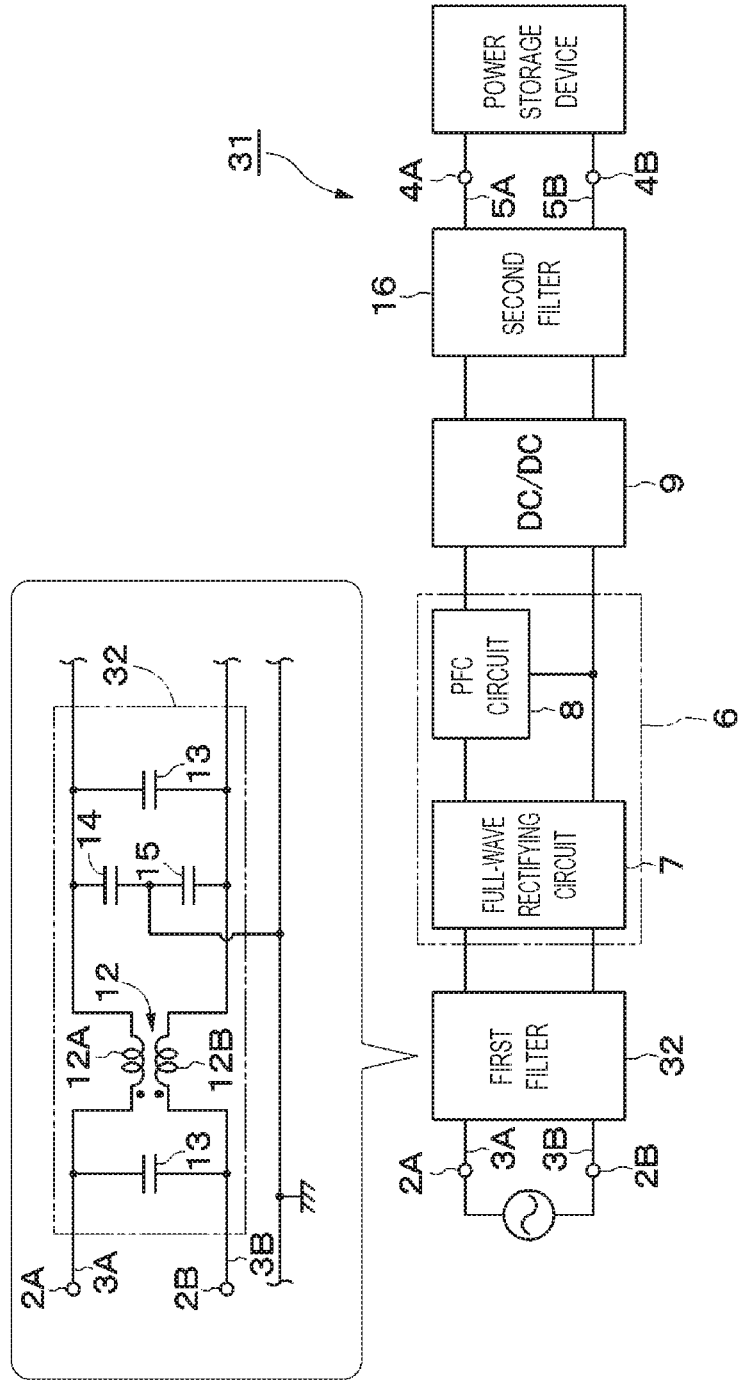
FIG. 6 is a block diagram illustrating an on-board charger according to a third embodiment of the present disclosure.

Subsequently, FIG. 6 illustrates a third embodiment of the present disclosure. The characteristic of the third embodiment lies in that in a first filter, connection is formed in the order of a first across-the-line capacitor, the first common mode choke coil, the first line bypass capacitors, and a first across-the-line capacitor according to nearness to the input ports. In the third embodiment, the same components as those in the afore-mentioned first embodiment are denoted by the same reference numerals, and description thereof is omitted.

An on-board charger 31 according to the third embodiment includes the input ports 2A and 2B, the output ports 4A and 4B, the AC-DC converter 6, the isolated DC-DC converter 9, a first filter 32, and the second filter 16, like the first embodiment.

The first filter 32 is connected to the input ports 2A and 2B. The first filter 32 includes the first common mode choke coil 12, the first across-the-line capacitors 13, and the first line bypass capacitors 14 and 15. In this case, in the first filter 32, connection is formed in the order of a first across-the-line capacitor 13, the first common mode choke coil 12, the first line bypass capacitors 14 and 15, and a first across-the-line capacitor 13 according to nearness to the input ports 2A and 2B.

Also in the third embodiment in the configuration as described above, almost the same effects and operations as those in the afore-mentioned first embodiment can thus be obtained. In addition, the first filter 32 includes the two first across-the-line capacitors 13 and thus can enhance the elimination effect on the normal mode noise as compared with the case where the only one first across-the-line capacitor 13 is provided.

Figure 7:
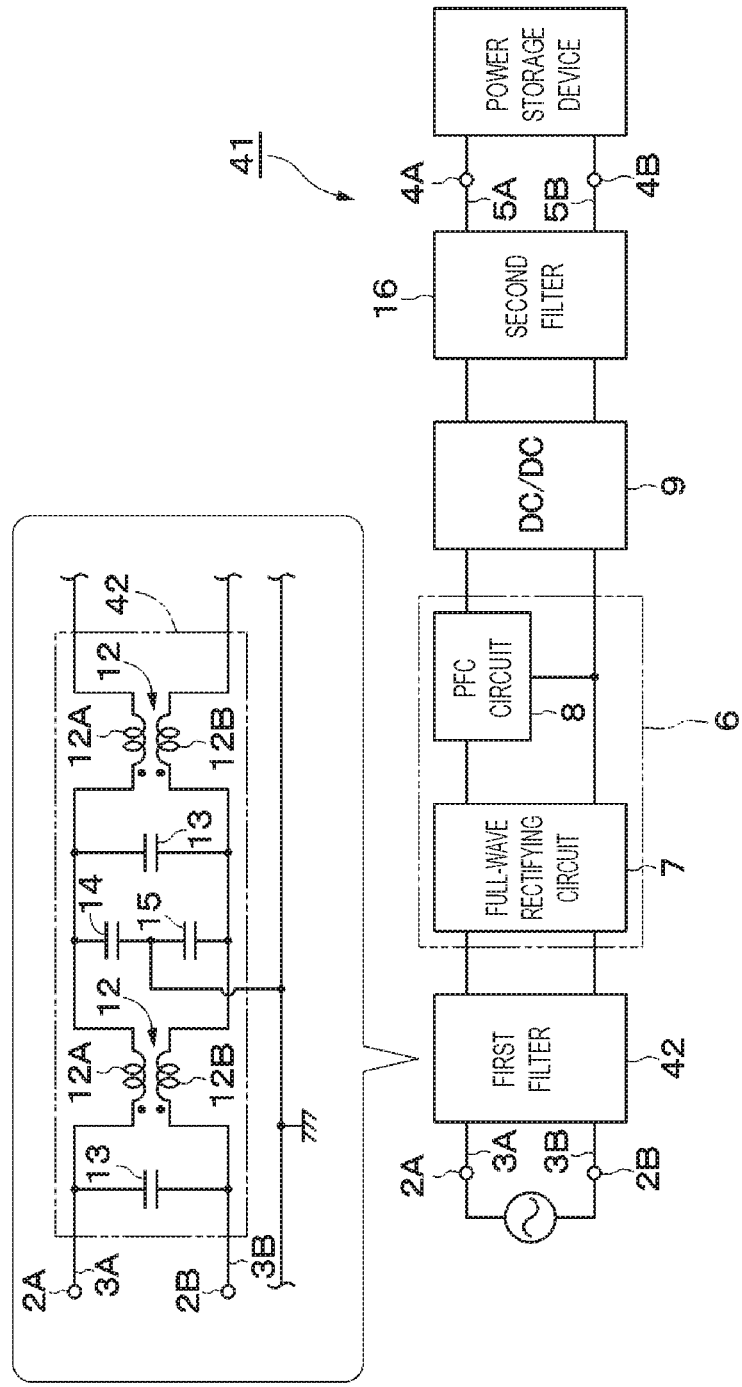
FIG. 7 is a block diagram illustrating an on-board charger according to a fourth embodiment of the present disclosure.

Subsequently, FIG. 7 illustrates a fourth embodiment of the present disclosure. The characteristic of the fourth embodiment lies in that in a first filter, connection is formed in the order of a first across-the-line capacitor, a first common mode choke coil, the first line bypass capacitors, a first across-the-line capacitor, and a first common mode choke coil according to nearness to the input ports. In the fourth embodiment, the same components as those in the afore-mentioned first embodiment are denoted by the same reference numerals, and description thereof is omitted.

An on-board charger 41 according to the fourth embodiment includes the input ports 2A and 2B, the output ports 4A and 4B, the AC-DC converter 6, the isolated DC-DC converter 9, a first filter 42, and the second filter 16, like the first embodiment.

The first filter 42 is connected to the input ports 2A and 2B. The first filter 42 includes the first common mode choke coils 12, the first across-the-line capacitors 13, and the first line bypass capacitors 14 and 15. In this case, in the first filter 42, connection is formed in the order of a first across-the-line capacitor 13, a first common mode choke coil 12, the first line bypass capacitors 14 and 15, a first across-the-line capacitor 13, and a first common mode choke coil 12 according to nearness to the input ports 2A and 2B.

Also in the fourth embodiment in the configuration as described above, almost the same effects and operations as those in the afore-mentioned first embodiment can thus be obtained. In addition, the first filter 42 includes the two first common mode choke coils 12 and thus can enhance the elimination effect on the common mode noise as compared with the case where the only one first common mode choke coil 12 is provided. In addition to this, the first filter 42 includes the two first across-the-line capacitors 13 and thus can attenuate the normal mode noise as compared with the case where the one first across-the-line capacitor 13 is provided.

Figure 8:
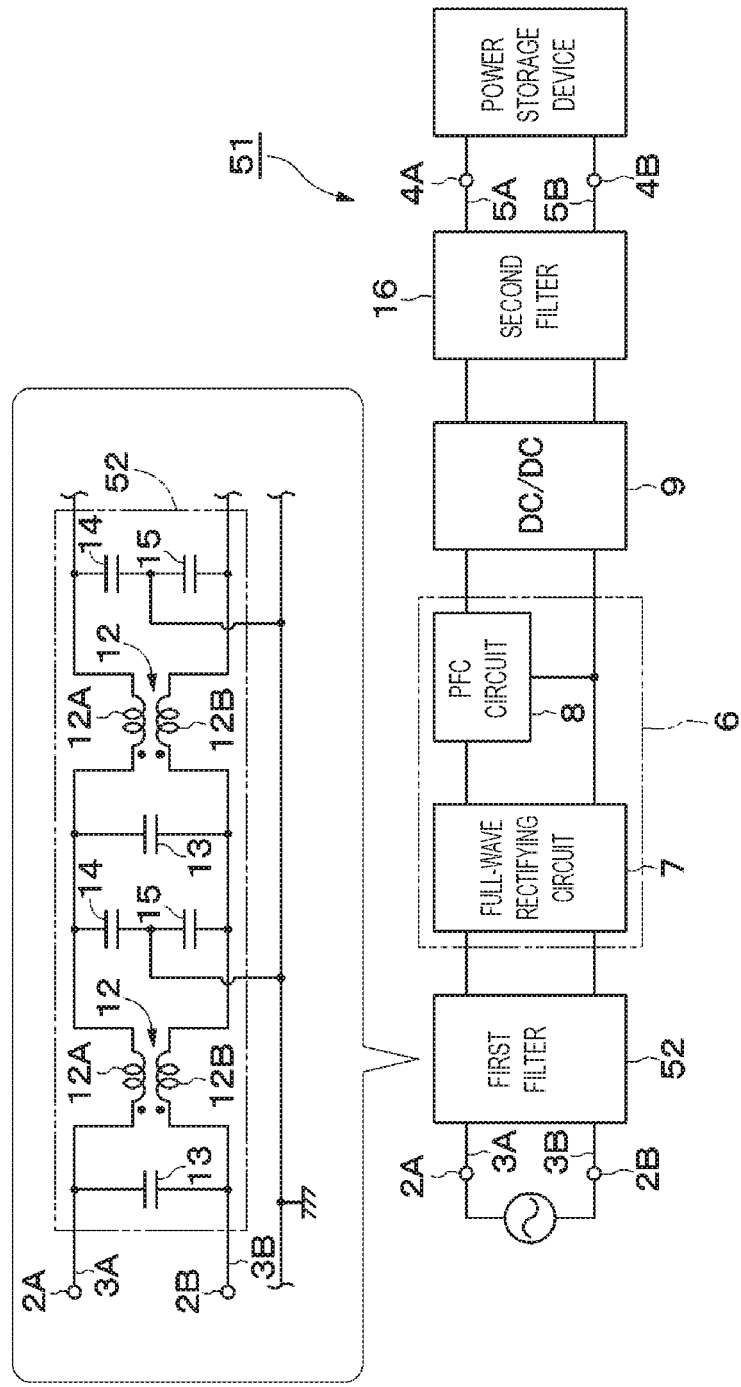
FIG. 8 is a block diagram illustrating an on-board charger according to a fifth embodiment of the present disclosure.

Subsequently, FIG. 8 illustrates a fifth embodiment of the present disclosure. The characteristic of the fifth embodiment lies in that in a first filter, connection is formed in the order of a first across-the-line capacitor, a first common mode choke coil, the first line bypass capacitors, a first across-the-line capacitor, a first common mode choke coil, and the first line bypass capacitors according to nearness to the input ports. In the fifth embodiment, the same components as those in the afore-mentioned first embodiment are denoted by the same reference numerals, and description thereof is omitted.

An on-board charger 51 according to the fifth embodiment includes the input ports 2A and 2B, the output ports 4A and 4B, the AC-DC converter 6, the isolated DC-DC converter 9, a first filter 52, and the second filter 16, like the first embodiment.

The first filter 52 is connected to the input ports 2A and 2B. The first filter 52 includes the first common mode choke coils 12, the first across-the-line capacitors 13, and the first line bypass capacitors 14 and 15. In this case, in the first filter 52, connection is formed in the order of a first across-the-line capacitor 13, a first common mode choke coil 12, the first line bypass capacitors 14 and 15, a first across-the-line capacitors 13, a first common mode choke coil 12, and the first line bypass capacitors 14 and 15 according to nearness to the input ports 2A and 2B.

Also in the fifth embodiment in the configuration as described above, almost the same effects and operations as those in the afore-mentioned first embodiment can thus be obtained. In addition, the first filter 52 includes the two first common mode choke coils 12 and thus can enhance the elimination effect on the common mode noise as compared with the case where the only one first common mode choke coil 12 is provided. In addition, the first filter 52 includes the two first across-the-line capacitors 13 and thus can attenuate the normal mode noise as compared with the case where the one first across-the-line capacitor 13 is provided. In addition to this, the first filter 52 includes the first line bypass capacitors 14 and 15 the numbers of which are each 2 and thus can attenuate the noise to propagate to the alternating current lines 3A and 3B as compared with the case where the first line bypass capacitors 14 and 15 the numbers of which are each 1 are provided.

Figure 9:
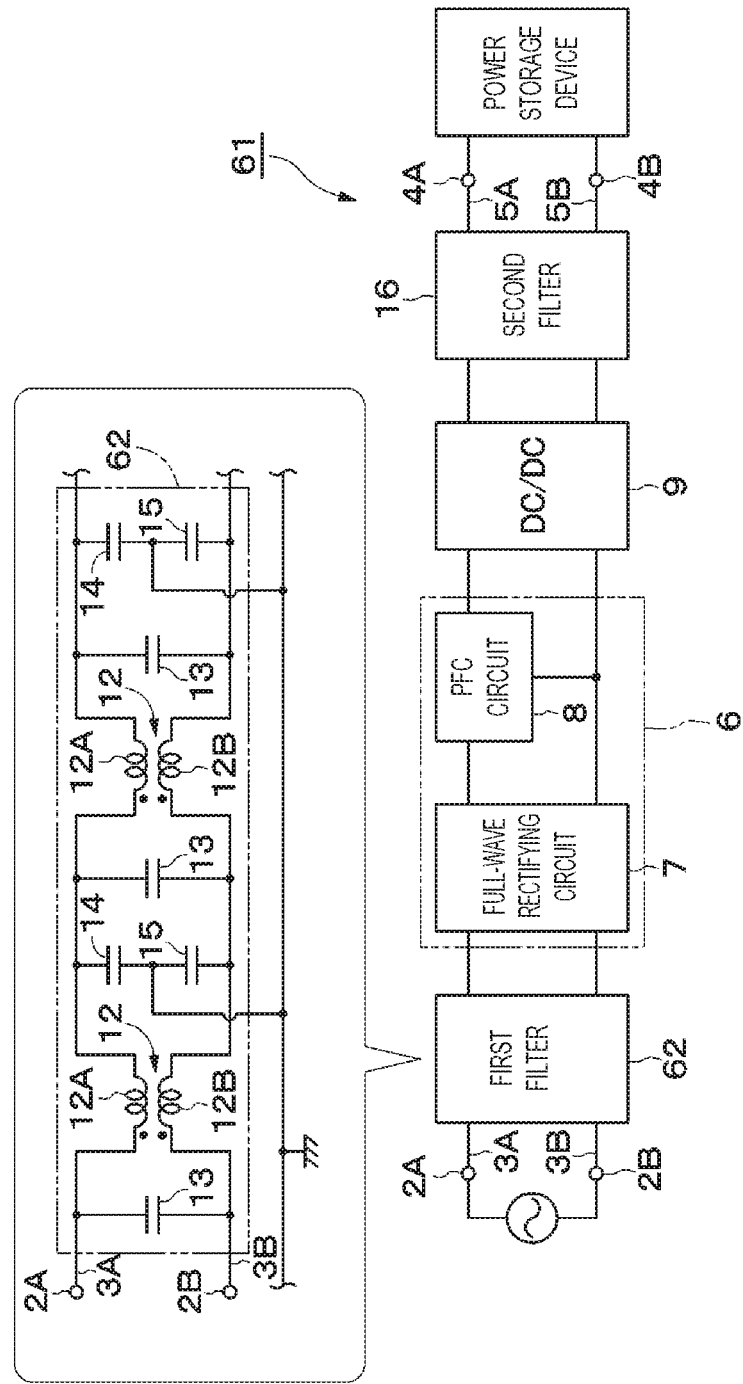
FIG. 9 is a block diagram illustrating an on-board charger according to a sixth embodiment of the present disclosure.

Subsequently, FIG. 9 illustrates a sixth embodiment of the present disclosure. The characteristic of the sixth embodiment lies in that in a first filter, connection is formed in the order of a first across-the-line capacitor, a first common mode choke coil, the first line bypass capacitors, a first across-the-line capacitor, a first common mode choke coil, a first across-the-line capacitor, and the first line bypass capacitors according to nearness to the input ports. In the sixth embodiment, the same components as those in the afore-mentioned first embodiment are denoted by the same reference numerals, and description thereof is omitted.

An on-board charger 61 according to the sixth embodiment includes the input ports 2A and 2B, the output ports 4A and 4B, the AC-DC converter 6, the isolated DC-DC converter 9, a first filter 62, and the second filter 16, like the first embodiment.

The first filter 62 is connected to the input ports 2A and 2B. The first filter 62 includes the first common mode choke coils 12, the first across-the-line capacitors 13, and the first line bypass capacitors 14 and 15. In this case, in the first filter 62, connection is formed in the order of a first across-the-line capacitor 13, a first common mode choke coil 12, the first line bypass capacitors 14 and 15, a first across-the-line capacitor 13, a first common mode choke coil 12, a first across-the-line capacitor 13, and the first line bypass capacitors 14 and 15 according to nearness to the input ports 2A and 2B.

Also in the sixth embodiment in the configuration as described above, almost the same effects and operations as those in the afore-mentioned first embodiment can thus be obtained.

Note that the first to sixth embodiments, the first filters 11, 22, 32, 42, 52, and 62 include the first common mode choke coils 12, the first across-the-line capacitors 13, and the first line bypass capacitors 14 and 15. However, the first to sixth embodiments have different numbers and arrangement of the first common mode choke coils 12, the first across-the-line capacitors 13, and the first line bypass capacitors 14 and 15. The noise restraint effect differs depending on the numbers and arrangement of these components. Accordingly, depending on the necessary noise restraint effect, the numbers and arrangement of the first common mode choke coils 12, the first across-the-line capacitors 13, and the first line bypass capacitors 14 and 15 need to be selected appropriately.

In the first to sixth embodiments, the first filters 11, 22, 32, 42, 52, and 62 include the first common mode choke coils 12 and the first line bypass capacitors 14 and 15 the numbers of which are each a corresponding one of 1 and 2 but may include the first common mode choke coils 12 and the first line bypass capacitors 14 and 15 the numbers of which are 3 or more. In addition, in the first to sixth embodiments, the first filters 11, 22, 32, 42, 52, and 62 include the first across-the-line capacitors 13 the numbers of which are each a corresponding one of 1, 2, and 3 but may include four or more first across-the-line capacitors 13.

Figure 10:
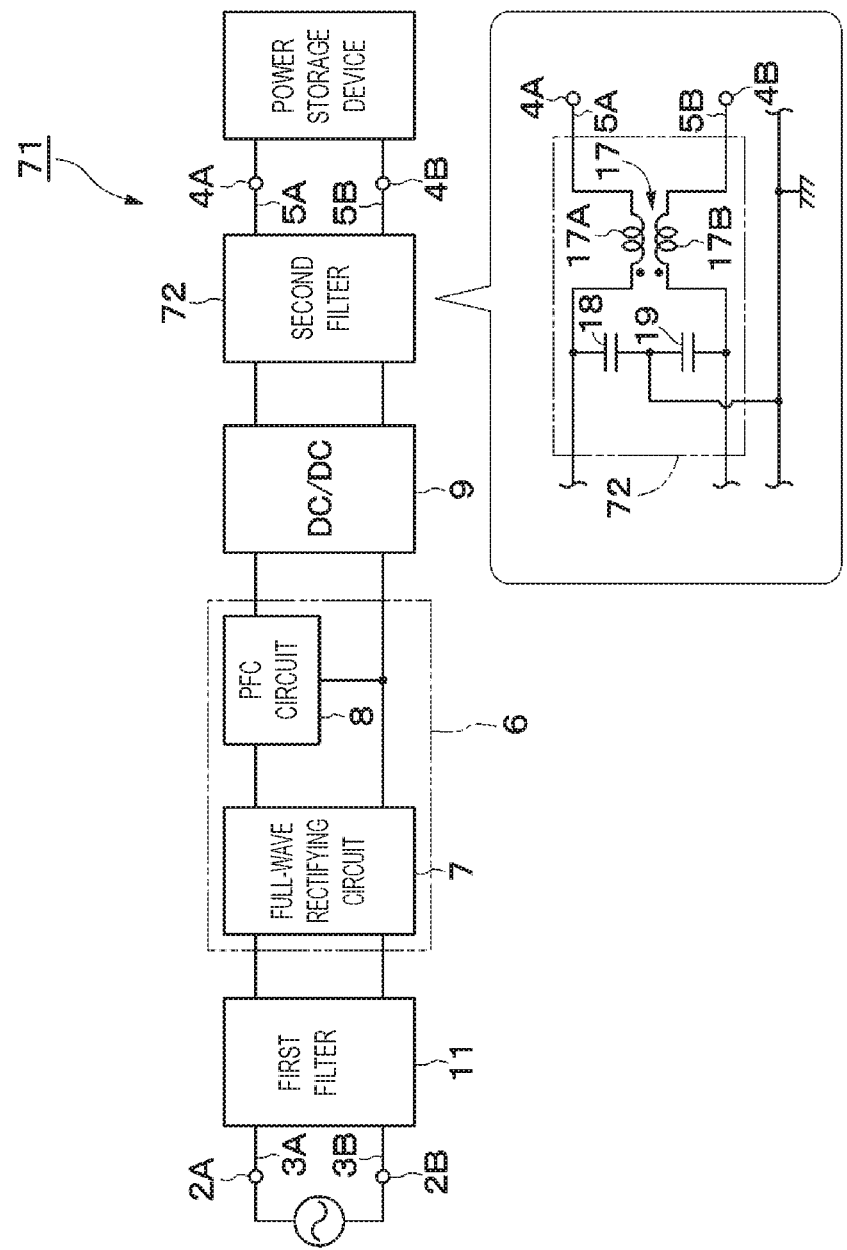
FIG. 10 is a block diagram illustrating an on-board charger according to a seventh embodiment of the present disclosure.

Subsequently, FIG. 10 illustrates a seventh embodiment of the present disclosure. The characteristic of the seventh embodiment lies in that in a second filter, the second common mode choke coil is connected closer to the output side than the second line bypass capacitors are. In the seventh embodiment, the same components as those in the afore-mentioned first embodiment are denoted by the same reference numerals, and description thereof is omitted.

An on-board charger 71 according to the seventh embodiment includes the input ports 2A and 2B, the output ports 4A and 4B, the AC-DC converter 6, the isolated DC-DC converter 9, the first filter 11, and a second filter 72, like the first embodiment.

The second filter 72 is connected to the output ports 4A and 4B. Specifically, the second filter 72 is located between the isolated DC-DC converter 9 and each of the output ports 4A and 4B and is connected to the direct current lines 5A and 5B each located between a corresponding one of the output ports 4A and 4B and the isolated DC-DC converter 9. The second filter 72 includes the second common mode choke coil 17 and the second line bypass capacitors 18 and 19. In this case, in the second filter 72, the second common mode choke coil 17 is connected closer to the output side than the second line bypass capacitors 18 and 19 are.

Also in the seventh embodiment in the configuration as described above, almost the same effects and operations as those in the afore-mentioned first embodiment can thus be obtained.

Figure 11:
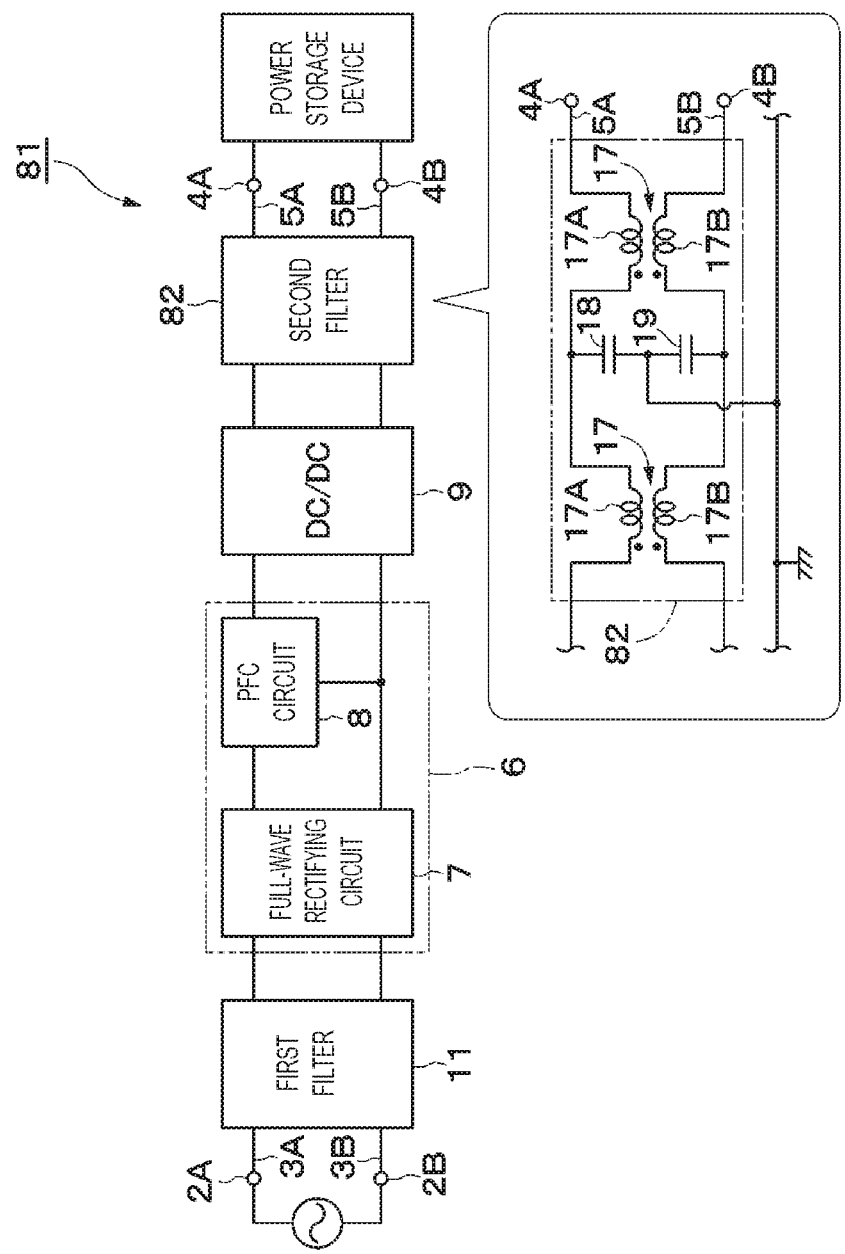
FIG. 11 is a block diagram illustrating an on-board charger according to an eighth embodiment of the present disclosure.

Subsequently, FIG. 11 illustrates an eighth embodiment of the present disclosure. The characteristic of the eighth embodiment lies in that in a second filter, connection is formed in the order of a second common mode choke coil, the second line bypass capacitors, and a second common mode choke coil according to nearness to the output ports. In the eighth embodiment, the same components as those in the afore-mentioned first embodiment are denoted by the same reference numerals, and description thereof is omitted.

An on-board charger 81 according to the eighth embodiment includes the input ports 2A and 2B, the output ports 4A and 4B, the AC-DC converter 6, the isolated DC-DC converter 9, the first filter 11, and a second filter 82, like the first embodiment.

The second filter 82 is connected to the output ports 4A and 4B. Specifically, the second filter 82 is located between the isolated DC-DC converter 9 and each of the output ports 4A and 4B and is connected to the direct current lines 5A and 5B each located between a corresponding one of the output ports 4A and 4B and the isolated DC-DC converter 9. The second filter 82 includes the second common mode choke coils 17 and the second line bypass capacitors 18 and 19. In this case, in the second filter 82, connection is formed in the order of a second common mode choke coil 17, the second line bypass capacitors 18 and 19, and a second common mode choke coil 17 according to nearness to the output ports 4A and 4B.

In this case, the two second common mode choke coils 17 may have mutually the same inductance value or may have mutually different inductance values. However, the inductance value of the at least one second common mode choke coil 17 included in the second filter 82 is lower than the inductance value of the at least one first common mode choke coil 12 included in the first filter 11.

Also in the eighth embodiment in the configuration as described above, almost the same effects and operations as those in the afore-mentioned first embodiment can thus be obtained. In addition, the second filter 82 includes the two second common mode choke coils 17 and thus can enhance the elimination effect on the common mode noise as compared with the case where the only one second common mode choke coil 17 is provided.

Figure 12:
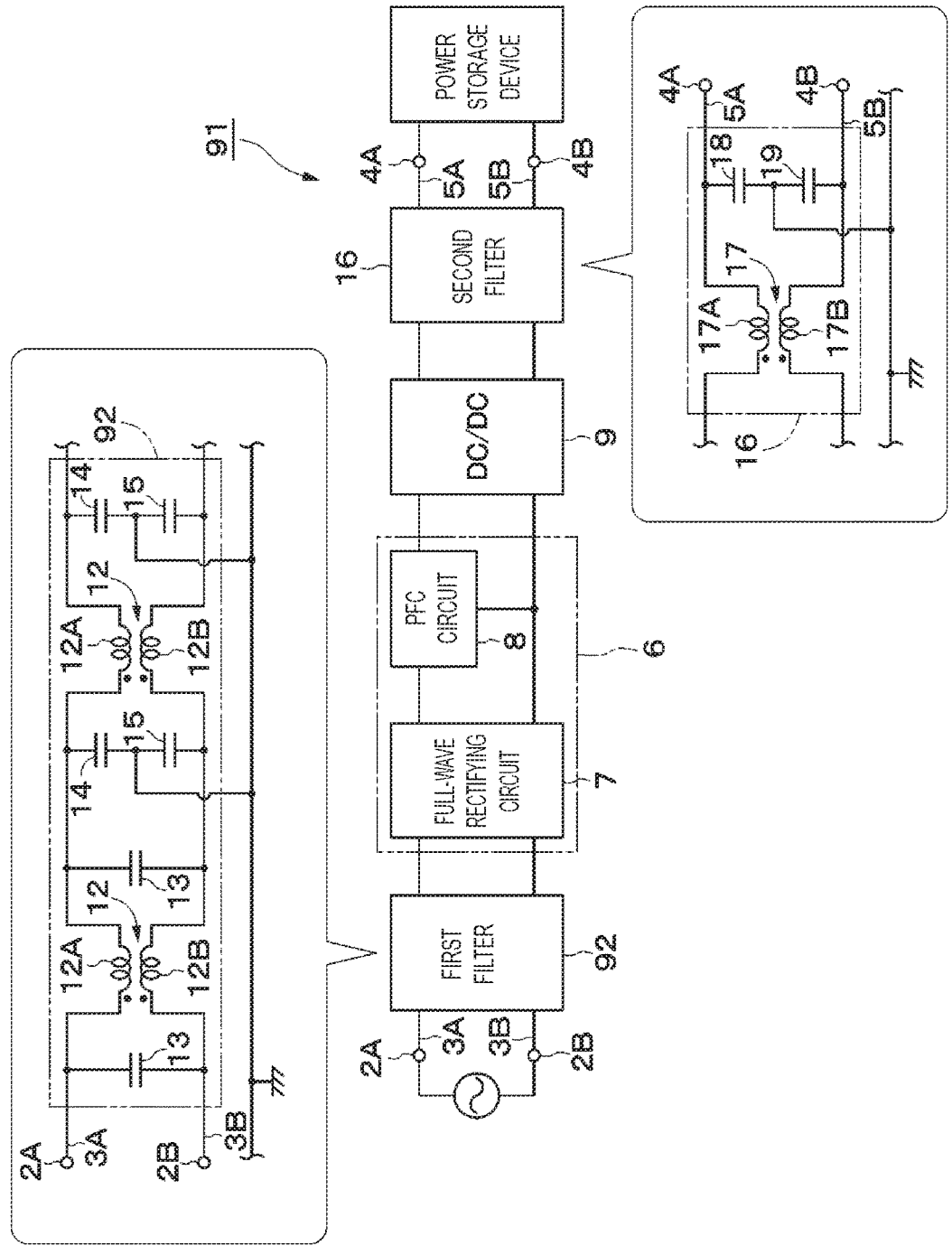
FIG. 12 is a block diagram illustrating an on-board charger according to a ninth embodiment of the present disclosure.

Subsequently, FIG. 12 illustrates a ninth embodiment of the present disclosure. The characteristic of the ninth embodiment lies in that in a first filter, connection is formed in the order of a first across-the-line capacitor, a first common mode choke coil, a first across-the-line capacitor, the first line bypass capacitors, a first common mode choke coil, and the first line bypass capacitors according to nearness to the input ports. In the ninth embodiment, the same components as those in the afore-mentioned first embodiment are denoted by the same reference numerals, and description thereof is omitted.

An on-board charger 91 according to the ninth embodiment includes the input ports 2A and 2B, the output ports 4A and 4B, the AC-DC converter 6, the isolated DC-DC converter 9, a first filter 92, and the second filter 16, like the first embodiment.

The first filter 92 is connected to the input ports 2A and 2B. The first filter 92 includes the first common mode choke coils 12, the first across-the-line capacitors 13, and the first line bypass capacitors 14 and 15. In this case, in the first filter 92, connection is formed in the order of a first across-the-line capacitor 13, a first common mode choke coil 12, a first across-the-line capacitor 13, the first line bypass capacitors 14 and 15, a first common mode choke coil 12, and the first line bypass capacitors 14 and 15 according to nearness to the input ports 2A and 2B.

In this case, the two first common mode choke coils 12 may have mutually the same inductance value or may have mutually different inductance values. The inductance value of the second common mode choke coil 17 of the second filter 16 is a value lower than the inductance value of the at least one first common mode choke coil 12 included in the first filter 92.

The two first common mode choke coils 12 may have mutually the same common mode impedance value or different values. In addition to this, a common mode impedance value $Zc2$ of the second common mode choke coil 17 of the second filter 16 at 30 MHz is a value lower than twice as high as a common mode impedance value $Zc1$ of one of the two first common mode choke coils 12 that has a higher value, the first common mode choke coils 12 being included in the first filter 92 ($Zc2 < 2 \times Zc1$).

Also in the ninth embodiment in the configuration as described above, almost the same effects and operations as those in the afore-mentioned first embodiment can thus be obtained. In addition, the second filter 16 that outputs direct current includes the second common mode choke coil 17, and thereby radiated emission can be reduced. However, an excessively high common mode impedance of the second common mode choke coil 17 at 30 MHz leads to an increase of the noise level of 30 MHz.

As the result of earnest study by the inventors, it is proved that if the common mode impedance value $Zc2$ of the second common mode choke coil 17 of the second filter 16 at 30 MHz is set lower than twice as high as the common mode impedance value $Zc1$ of the first common mode choke coil 12 of the first filter 92 ($Zc2<2\times Zc1$), the noise level of 30 MHz can thereby be restrained.

Figure 13:
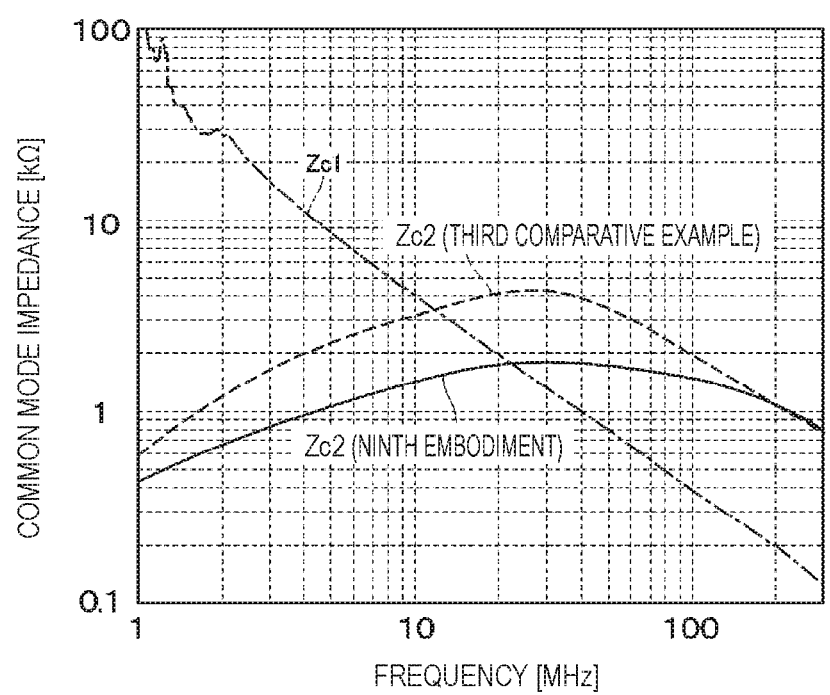
FIG. 13 is a characteristic curve diagram illustrating the frequency characteristics of the common mode impedance of a first common mode choke coil and second common mode choke coils.

That is, in the ninth embodiment, the common mode impedance value $Zc2$ (see the solid line in FIG. 13) of the second common mode choke coil 17 of the second filter 16 at 30 MHz is lower than twice as high as the common mode impedance value $Zc1$ (see the dashed line in FIG. 13) of the first common mode choke coil 12 of the first filter 92 ($Zc2<2\times Zc1$). In contrast, in the third comparative example, the common mode impedance value $Zc2$ (see the broken line in FIG. 13) of the second common mode choke coil 17 of the second filter 16 at 30 MHz is higher than twice as high as the common mode impedance value $Zc1$ of the first common mode choke coil 12 of the first filter 92 ($Zc2>2\times Zc1$).

Figure 14:
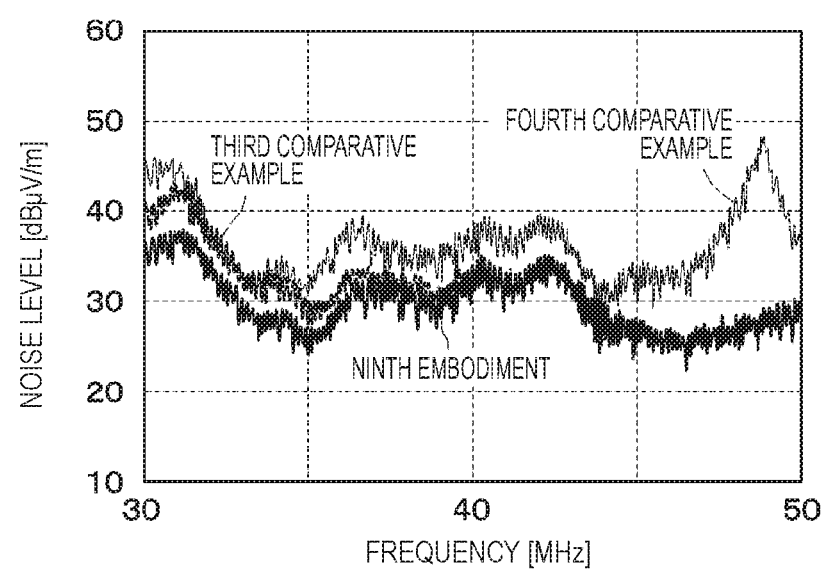
FIG. 14 is a characteristic curve diagram illustrating the frequency characteristics of noise levels in the ninth embodiment and the third and fourth comparative examples.

The frequency characteristics of noise levels are measured for the ninth embodiment and the third comparative example. FIG. 14 illustrates the results thereof. As illustrated by the broken line in FIG. 14, the radiated emission can be reduced also in the third comparative example as compared with the fourth comparative example (see the dashed line in FIG. 14) in which the second common mode choke coil 17 is omitted in the second filter 16. However, an excessively high common mode impedance value $Zc2$ of the second common mode choke coil 17 of the second filter 16 leads to an increase of the noise level of 30 MHz.

This is based on the following reason. If the second filter 16 includes the second common mode choke coil 17, noise propagating from the input ports 2A and 2B toward the output ports 4A and 4B is reflected by the second common mode choke coil 17. The higher the common mode impedance value $Zc2$ of the second common mode choke coil 17, the larger the amount of reflected noise. The reflected noise propagates toward the first filter 92. Accordingly, the reflected noise is reduced by the first common mode choke coil 12 of the first filter 92. If the common mode impedance value $Zc2$ of the second common mode choke coil 17 is excessive compared with the common mode impedance value $Zc1$ of the first common mode choke coil 12, it is not possible for the first common mode choke coil 12 to sufficiently reduce the noise reflected by the second common mode choke coil 17.

In consideration of the problem as described above, in the ninth embodiment, the common mode impedance value $Zc2$ of the second common mode choke coil 17 is lower than twice as high as the common mode impedance value $Zc1$ of the first common mode choke coil 12 of the first filter 92 ($Zc2<2\times Zc1$). As illustrated by the solid line in FIG. 14, radiated emission at 30 MHz or higher can thereby be restrained to be low in the ninth embodiment.

Note that in the embodiments, each of the second filters 16, 72, and 82 does not include an across-the-line capacitor provided on the direct current side and connected between the two direct current lines 5A and 5B but may include the across-the-line capacitor on the direct current side. However, normal mode noise propagating to the direct current lines 5A and 5B is relatively low. Accordingly, to obtain a necessary noise restraint effect, the across-the-line capacitor on the direct current side may be omitted.

In the embodiments, the second filters 16, 72, and 82 include one or two second common mode choke coils 17 but may include three or more second common mode choke coils 17. In addition, in the embodiments, the second filters 16, 72, and 82 each include the second line bypass capacitors 18 and 19 the numbers of which are each 1 but may include the second line bypass capacitors 18 and 19 the numbers of which are each 2 or more.

In the embodiments, the on-board chargers 1, 21, 31, 41, 51, 61, 71, 81, and 91 are exemplified as the power supply device. The present disclosure is not limited to these, and the power supply device may be any power supply device that converts alternating current power to direct current power and that supplies the direct current power having a desired voltage value. Accordingly, the power supply device of the present disclosure may be applied to, for example, a fixed or portable charger and may also be applied to a direct current power supply device that continuously supplies the direct current power.

Specific numerical values of the frequencies and the like described in the embodiments represent examples and are not limited to the exemplified values. These numerical values are appropriately set in accordance with, for example, the specifications of material to be applied.

The embodiments are examples, and it goes without saying that the configurations described in the respective different embodiments can be partially replaced or combined.

Subsequently, the disclosure included in the embodiments described above will be described. According to the present disclosure, a power supply device includes input ports respectively connected to two alternating current lines to which alternating current power is input, output ports respectively connected to two direct current lines from which direct current power is output, a first filter connected to the input ports, an AC-DC converter that is connected to the first filter and that converts the alternating current power to the direct current power, an isolated DC-DC converter that is connected to the AC-DC converter and that converts a direct current voltage to a direct current voltage having a predetermined voltage value, and a second filter connected between the isolated DC-DC converter and each of the output ports. The first filter includes at least one first common mode choke coil connected at halfway points of the two alternating current lines, at least one first across-the-line capacitor connected between the two alternating current lines, and at least one first line bypass capacitor connected between each of the two alternating current lines and a ground. The second filter includes at least one second common mode choke coil and a second line bypass capacitor, the second common mode choke coil being connected at halfway points of the two direct current lines, the second line bypass capacitor being connected between each of the two direct current lines and a ground. Noise in a wide band from a low frequency to a high frequency can thereby be restrained.

According to the present disclosure, in the first filter, connection is formed in order of the first across-the-line capacitor, the first common mode choke coil, and the first line bypass capacitor according to nearness to the input ports. The first filter can thereby restrain low frequency noise.

According to the present disclosure, in the first filter, connection is formed in order of one of the first across-the-line capacitors, the first common mode choke coil, the first line bypass capacitor, and one of the first across-the-line capacitors according to nearness to the input ports. The first filter can thereby restrain the low frequency noise.

According to the present disclosure, in the first filter, connection is formed in order of one of the first across-the-line capacitors, one of the first common mode choke coils, the first line bypass capacitor, one of the first across-the-line capacitors, and one of the first common mode choke coils according to nearness to the input ports. The first filter can thereby restrain the low frequency noise.

According to the present disclosure, in the first filter, connection is formed in order of one of the first across-the-line capacitors, one of the first common mode choke coils, one of the first line bypass capacitors, one of the first across-the-line capacitors, one of the first common mode choke coils, and one of the first line bypass capacitors according to nearness to the input ports. The first filter can thereby restrain the low frequency noise.

According to the present disclosure, in the first filter, connection is formed in order of one of the first across-the-line capacitors, one of the first common mode choke coils, one of the first line bypass capacitors, one of the first across-the-line capacitors, one of the first common mode choke coils, one of the first line bypass capacitors, and one of the first across-the-line capacitors according to nearness to the input ports. The first filter can thereby restrain the low frequency noise.

According to the present disclosure, in the first filter, connection is formed in order of one of the first across-the-line capacitors, one of the first common mode choke coils, one of the first line bypass capacitors, one of the first across-the-line capacitors, one of the first common mode choke coils, one of the first across-the-line capacitors, and one of the first line bypass capacitors according to nearness to the input ports. The first filter can thereby restrain the low frequency noise.

According to the present disclosure, in the second filter, the second common mode choke coil is connected closer to an output side than the second line bypass capacitor is. The second filter can thereby restrain high frequency noise.

According to the present disclosure, in the second filter, the second line bypass capacitor is connected closer to an output side than the second common mode choke coil is. The second filter can thereby restrain the high frequency noise.

According to the present disclosure, in the second filter, connection is formed in order of one of the second common mode choke coils, the second line bypass capacitor, and one of the second common mode choke coils according to nearness to the output ports. The second filter can thereby restrain the high frequency noise.

According to the present disclosure, an inductance value of the at least one second common mode choke coil included in the second filter is lower than an inductance value of the at least one first common mode choke coil included in the first filter. In this case, the first filter reduces the low frequency noise. Accordingly, the inductance value of the first common mode choke coil preferably has a high value. In contrast, the second filter reduces the high frequency noise. Accordingly, the inductance value of the second common mode choke coil can be set as a value lower than the inductance value of the at least one first common mode choke coil. As the result, the second common mode choke coil and the second filter can be downsized.

According to the present disclosure, in the first filter, connection is formed in order of one of the first across-the-line capacitors, one of the first common mode choke coils, one of the first across-the-line capacitors, one of the first line bypass capacitors, one of the first common mode choke coils, and one of the first line bypass capacitors according to nearness to the input ports. In the second filter, connection is formed in order of the second line bypass capacitor and the second common mode choke coil according to nearness to the output ports. An inductance value of the second common mode choke coil included in the second filter is lower than an inductance value of the at least one first common mode choke coil included in the first filter. A common mode impedance value of the second common mode choke coil included in the second filter at 30 MHz is lower than twice as high as a common mode impedance value of one of the two first common mode choke coils that has a higher value, the two first common mode choke coils being included in the first filter. Radiated emission at 30 MHz or higher can thereby be restrained.

The power supply device of the present disclosure is applied to an on-board charger. In this case, the first filter and the second filter are composed of passive elements and do not lower the power factor in the power conversion. Accordingly, the power storage device installed in the vehicle can be charged with high efficiency.

What is claimed is:

1. A power supply device comprising:
   input ports respectively connected to two alternating current lines to which alternating current power is input;
   output ports respectively connected to two direct current lines from which direct current power is output;
   a first filter connected to the input ports;
   an AC-DC converter that is connected to the first filter and that is configured to convert the alternating current power to the direct current power;
   an isolated DC-DC converter that is connected to the AC-DC converter and that is configured to convert a direct current voltage to a direct current voltage having a predetermined voltage value; and
   a second filter connected between the isolated DC-DC converter and each of the output ports,
   wherein
   the first filter includes at least one first common mode choke coil connected at halfway points of the two alternating current lines, at least one first across-the-line capacitor connected between the two alternating current lines, and at least one first line bypass capacitor connected between each of the two alternating current lines and a ground, and
   the second filter includes at least one second common mode choke coil and a second line bypass capacitor, the second common mode choke coil being connected at halfway points of the two direct current lines, the second line bypass capacitor being connected between each of the two direct current lines and a ground.

2. The power supply device according to claim 1, wherein in the first filter, connection is formed in order of the first across-the-line capacitor, the first common mode choke coil, and the first line bypass capacitor according to nearness to the input ports.

3. The power supply device according to claim 1, wherein in the first filter, connection is formed in order of one of the first across-the-line capacitors, the first common mode choke coil, the first line bypass capacitor, and one of the first across-the-line capacitors according to nearness to the input ports.

4. The power supply device according to claim 1, wherein in the first filter, connection is formed in order of one of the first across-the-line capacitors, one of the first common mode choke coils, the first line bypass capacitor, one of the first across-the-line capacitors, and one of the first common mode choke coils according to nearness to the input ports.

5. The power supply device according to claim 1, wherein in the first filter, connection is formed in order of one of the first across-the-line capacitors, one of the first common mode choke coils, one of the first line bypass capacitors, one of the first across-the-line capacitors, one of the first common mode choke coils, and one of the first line bypass capacitors according to nearness to the input ports.

6. The power supply device according to claim 1, wherein in the first filter, connection is formed in order of one of the first across-the-line capacitors, one of the first common mode choke coils, one of the first line bypass capacitors, one of the first across-the-line capacitors, one of the first common mode choke coils, one of the first line bypass capacitors, and one of the first across-the-line capacitors according to nearness to the input ports.

7. The power supply device according to claim 1, wherein in the first filter, connection is formed in order of one of the first across-the-line capacitors, one of the first common mode choke coils, one of the first line bypass capacitors, one of the first across-the-line capacitors, one of the first common mode choke coils, one of the first across-the-line capacitors, and one of the first line bypass capacitors according to nearness to the input ports.

8. The power supply device according to claim 1, wherein in the second filter, the second common mode choke coil is connected closer to an output side than the second line bypass capacitor is.

9. The power supply device according to claim 1, wherein in the second filter, the second line bypass capacitor is connected closer to an output side than the second common mode choke coil is connected.

10. The power supply device according to claim 1, wherein in the second filter, connection is formed in order of one of the second common mode choke coils, the second line bypass capacitor, and one of the second common mode choke coils according to nearness to the output ports.

11. The power supply device according to claim 1, wherein an inductance value of the at least one second common mode choke coil included in the second filter is lower than an inductance value of the at least one first common mode choke coil included in the first filter.

12. The power supply device according to claim 1, wherein in the first filter, connection is formed in order of one of the first across-the-line capacitors, one of the first common mode choke coils, one of the first across-the-line capacitors, one of the first line bypass capacitors, one of the first common mode choke coils, and one of the first line bypass capacitors according to nearness to the input ports, in the second filter, connection is formed in order of the second line bypass capacitor and the second common mode choke coil according to nearness to the output ports, an inductance value of the second common mode choke coil included in the second filter is lower than an inductance value of the at least one first common mode choke coil included in the first filter, and a common mode impedance value of the second common mode choke coil included in the second filter at 30 MHz is lower than twice as high as a common mode impedance value of one of the two first common mode choke coils that has a higher value, the two first common mode choke coils being included in the first filter.

13. The power supply device according to claim 1, wherein
the power supply device is applied to an on-board charger.

14. The power supply device according to claim 2, wherein
in the second filter, the second common mode choke coil is connected closer to an output side than the second line bypass capacitor is.

15. The power supply device according to claim 3, wherein
in the second filter, the second common mode choke coil is connected closer to an output side than the second line bypass capacitor is.

16. The power supply device according to claim 2, wherein
in the second filter, the second line bypass capacitor is connected closer to an output side than the second common mode choke coil is connected.

17. The power supply device according to claim 3, wherein
in the second filter, the second line bypass capacitor is connected closer to an output side than the second common mode choke coil is connected.

18. The power supply device according to claim 2, wherein
in the second filter, connection is formed in order of one of the second common mode choke coils, the second line bypass capacitor, and one of the second common mode choke coils according to nearness to the output ports.

19. The power supply device according to claim 2, wherein
an inductance value of the at least one second common mode choke coil included in the second filter is lower than an inductance value of the at least one first common mode choke coil included in the first filter.

20. The power supply device according to claim 2, wherein
the power supply device is applied to an on-board charger.

* * * * *